United States Patent
Lin

(10) Patent No.: US 12,159,881 B2
(45) Date of Patent: Dec. 3, 2024

(54) MANUFACTURING METHOD OF ELECTRONIC DEVICE

(71) Applicant: InnoLux Corporation, Miao-Li County (TW)

(72) Inventor: Chun-Hsien Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 360 days.

(21) Appl. No.: 17/680,313

(22) Filed: Feb. 25, 2022

(65) Prior Publication Data

US 2022/0367529 A1    Nov. 17, 2022

(30) Foreign Application Priority Data

Mar. 26, 2021    (CN) .......................... 202110331205.8

(51) Int. Cl.
*H01L 27/12* (2006.01)

(52) U.S. Cl.
CPC ...... *H01L 27/1244* (2013.01); *H01L 27/1259* (2013.01)

(58) Field of Classification Search
None
See application file for complete search history.

(56) References Cited

U.S. PATENT DOCUMENTS

2003/0160907 A1    8/2003    Kweon et al.

FOREIGN PATENT DOCUMENTS

| CN | 107045994 A | | 8/2017 |
|---|---|---|---|
| KR | 20150078767 | * | 7/2015 |
| KR | 20180076159 | * | 7/2018 |

OTHER PUBLICATIONS

Machine-generated English translation of KR 20150078767 (Year: 2015).*
Machine-generated English translation of KR 20180076159 (Year: 2018).*

* cited by examiner

*Primary Examiner* — Bo B Jang
(74) *Attorney, Agent, or Firm* — Winston Hsu

(57) ABSTRACT

A manufacturing method of an electronic device is provided by the present disclosure. The method includes: providing a substrate including a non-discarding portion and a discarding portion adjacent to the non-discarding portion; forming a first test wiring extending through the non-discarding portion and the discarding portion; cutting the substrate on a target line, wherein the target line is aligned with a boundary between the non-discarding portion and the discarding portion; performing a first conducting test on the first test wiring; and determining the substrate to be in an off-target cutting state when a result of the first conducting test is a short circuit state, or determining the substrate to be in an on-target cutting state when the result of the first conducting test is an open circuit state.

7 Claims, 10 Drawing Sheets

MANUFACTURING METHOD OF ELECTRONIC DEVICE

BACKGROUND OF THE DISCLOSURE

1. Field of the Disclosure

The present disclosure relates to a manufacturing method of an electronic device, and more particular, to a manufacturing method of an electronic device being capable of detecting cutting and grinding results during a manufacturing process.

2. Description of the Prior Art

Nowadays, common electronic devices include tiling display panels, and the information can be provided to users through the tiling display panels. The tiling display panel includes a plurality of individual display panels connected to one another, and the individual display panels have a borderless design to reduce gaps between adjacent display panels. Therefore, in a manufacturing process of the individual display panels, scribing/breaking (SB) and grinding steps are required to remove frames. In addition, it is necessary to check whether the result meets the specification after the display panels are cut and grinded. In the conventional method, a person utilizes an optical microscope (OM) to confirm whether the results meet the specifications, making the tests relatively time-consuming and increasing chances of human errors.

SUMMARY OF THE DISCLOSURE

According to an embodiment of the present disclosure, a manufacturing method of an electronic device is provided. The manufacturing method includes: providing a substrate, wherein the substrate includes a non-discarding portion and a discarding portion adjacent to the non-discarding portion; forming a first test wiring extending through the non-discarding portion and the discarding portion; cutting the substrate on a target line, wherein the target line is aligned with a boundary between the non-discarding portion and the discarding portion; performing a first conducting test on the first test wiring; and determining the substrate to be in an off-target cutting state when a result of the first conducting test is a short circuit state, or determining the substrate to be in an on-target cutting state when the result of the first conducting test is an open circuit state.

These and other objectives of the present disclosure will no doubt become obvious to those of ordinary skill in the art after reading the following detailed description of the embodiment that is illustrated in the various figures and drawings.

DETAILED DESCRIPTION

Figure 1:
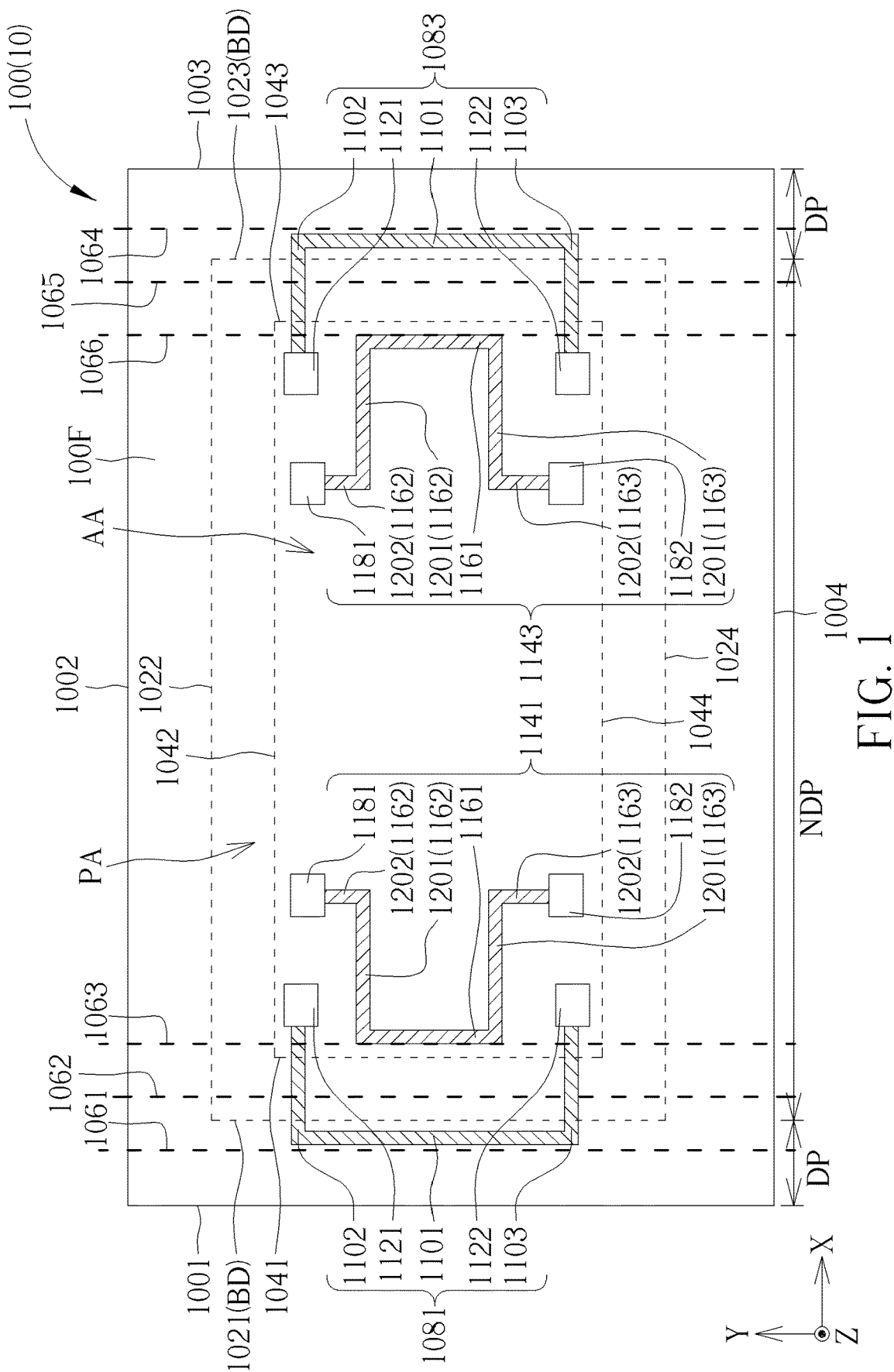
FIG. 1 is a top schematic view of a substrate of an electronic device without cutting and grinding according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "include" and "comprise" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. In addition, the arrangement relationship between different elements can be explained according to the drawings.

The electrical connection can be a direct connection or an indirect connection. The electrical connection between two components can be a direct contact to transmit electrical signals, and there are no other components between them. The electrical connection between two components can be achieved by bridging through the intermediate component between the two components to transmit electrical signals. The electrical connection can also be referred to as coupling.

Although terms such as first, second, third, etc., maybe used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element maybe a second constituent element in a claim.

It should be noted that the technical features in different embodiments described in the following can be replaced, recombined, or mixed with one another to constitute another embodiment without departing from the spirit of the present disclosure.

The electronic device of the present disclosure may include a display device, antenna, touch electronic device, curved electronic device or free shape electronic device, but not limited thereto. The electronic device may be a foldable electronic device or a flexible electronic device. The electronic device may for example include a light emitting diode, a liquid crystal, a fluorescence, a phosphor, other suitable display medium or the combinations thereof, but not limited thereto. The light emitting diode may for example include organic light emitting diode (OLED), inorganic light emitting diode (LED), mini light emitting diode (mini-LED), micro light emitting diode (micro-LED), quantum dots light emitting diode (QLED, QDLED), other suitable materials or the combinations of the above-mentioned materials, but not limited thereto. The display device may for example include a tiled display device, but not limited thereto. The concepts or principles of the present disclosure may also be applied to a liquid crystal display (LCD) device which is non-self-luminous, but not limited thereto.

The antenna may be a liquid crystal antenna or other types of antenna, but not limited thereto. The antenna may for example include a tiled antenna, but not limited thereto. It should be noted that the electronic device may be any combination of the above-mentioned devices, but not limited thereto. In addition, the shape of the electronic device may be a rectangular shape, a circular shape, a polygonal shape, a shape with curved edges or other suitable shapes. The electronic device may include peripheral systems such as a driving system, a controlling system, a light source system and a shelf system to support the display device, the antenna or the tiled device. In the following, a display device will be regarded as an electronic device to illustrate the content of the present disclosure, but the present disclosure is not limited thereto.

A direction X, a direction Y, and a direction Z are labeled in the following figures. The direction Z can be perpendicular to a surface 100F of a substrate 100, and the direction X and the direction Y can be parallel to the surface 100F of the substrate 100. The direction Z can be perpendicular to the direction X and the direction Y, and the direction X can be perpendicular to the direction Y. The following figures can describe a spatial relationship of a structure according to the direction X, the direction Y, and the direction Z.

Referring to FIG. 1, FIG. 1 is a top schematic view of a substrate of an electronic device without cutting and grinding according to a first embodiment of the present disclosure. An electronic device 10 of this embodiment is exemplified as a display device, but not limited thereto. Generally speaking, the display device can include two substrates that are opposite to each other and a display medium layer disposed between the two substrates. In order to highlight technical features of the present disclosure and make the figures more comprehensible, only one of the two substrates is drawn in the following figures of the present disclosure, and the display medium layer and the other one of the two substrates are omitted. In other possible implementations, the display device can include a substrate and a display medium layer disposed on the substrate.

Figure 4:
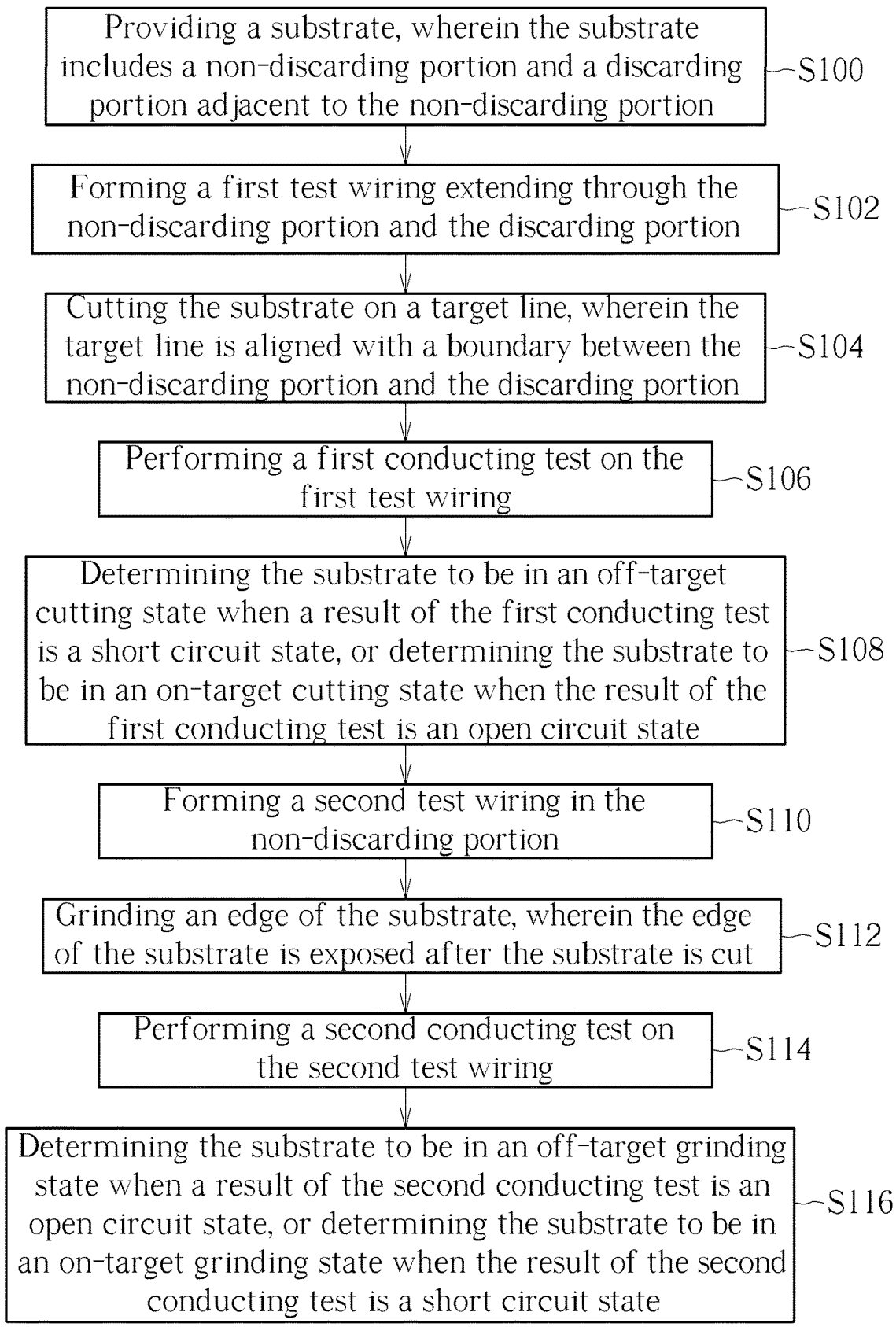
FIG. 4 is a flowchart of a manufacturing method of the electronic device according to the first embodiment of the present disclosure.

Referring to FIG. 1 and FIG. 4, FIG. 4 is a flowchart of a manufacturing method of the electronic device according to the first embodiment of the present disclosure. As shown in FIG. 4, a step S100 is first performed to provide a substrate, wherein the substrate includes a non-discarding portion and a discarding portion adjacent to the non-discarding portion. As shown in FIG. 1, the substrate 100 can be, for example, an array substrate of the display device, and the substrate 100 can include a plurality of thin-film transistors used for controlling the display medium layer and signal lines and control circuits used for controlling the thin-film transistors, but not limited thereto. The display medium layer can include the light emitting elements described in the above paragraphs. The display medium layer of this embodiment can include micro-LEDs, and the LEDs can be disposed on the substrate 100, but not limited thereto. However, in order to further simplify the drawings, the LEDs, thin-film transistors, signal lines, and control circuits are not drawn in the figures.

In other embodiments, the substrate 100 can also be, for example, a color filter substrate of a display device, but not limited thereto. In addition, a material of a base layer of the substrate 100 can include glass, quartz, sapphire, polymers (e.g., polyimide (PI), polyethylene terephthalate (PET)), and/or other suitable materials, so as to serve as a flexible substrate or a rigid substrate, but not limited thereto.

The substrate 100 can include an edge 1001, an edge 1002, an edge 1003, and an edge 1004, and the edges can be connected to one another to form a rectangle. In a method of the present disclosure, a target line 1021, a target line 1022, a target line 1023, and a target line 1024 can be preset on the surface 100F of the substrate 100, these target lines can serve as target lines for a scribe/break (SB) process, and the target lines can be connected to one another to form a rectangle. In addition, a target line 1041, a target line 1042, a target line 1043, and a target line 1044 can be preset on the surface 100F of the substrate 100, theses target lines can serve as target lines for a grinding process, and these target lines can also be connected to one another to form a rectangle.

The substrate 100 can have a display region AA and a peripheral region PA surrounding the display region AA. In order to achieve a borderless design, a rectangular area formed by the target line 1041, the target line 1042, the target line 1043, and the target line 1044 of the grinding process can correspond to or substantially correspond to the display region AA of the display device. The target line 1021, target line 1022, target line 1023, and target line 1024 of the cutting process can be disposed in the peripheral region PA of the display device, but not limited thereto.

As shown in FIG. 1, the target line 1021 can be disposed between the edge 1001 and the target line 1041, the target line 1022 can be disposed between the edge 1002 and the target line 1042, the target line 1023 can be disposed between the edge 1003 and the target line 1043, and the target line 1024 can be disposed between the edge 1004 and the target line 1044. The edge 1001, the edge 1003, the target line 1021, the target line 1023, the target line 1041, and/or the target line 1043 can be parallel to or substantially parallel to the direction Y. In addition, the edge 1002, the edge 1004, the target line 1022, the target line 1024, the target line 1042, and/or the target line 1044 can be parallel to or substantially parallel to the direction X.

In order to effectively control results of the cutting and grinding process, a specification line 1061 and a specification line 1062 can be defined based on the target line 1021, and a specification line 1063 can be defined based on the target line 1041. The specification line 1061 can be a lower specification limit (LSL) of the cutting process, the specification line 1062 can be an upper specification limit (USL) of the cutting process, and the target line 1021 is disposed between the specification line 1061 and the specification line 1062. In addition, the specification line 1063 can be the upper specification limit of the grinding process, and the target line 1041 is disposed between the specification line 1062 and the specification line 1063.

Similarly, the target line 1023 is disposed between a specification line 1064 and a specification line 1065, and the target line 1043 is disposed between the specification line 1065 and a specification line 1066. The specification line 1064 can be the lower specification limit of the cutting process, the specification line 1065 can be the upper specification limit of the cutting process, and the specification line 1066 can be the upper specification limit of the grinding process.

As shown in FIG. 1, in the direction X, a region of the substrate at the right side of the target line 1021 or at the left side of the target line 1023 or a region of the substrate between the target line 1021 and the target line 1023 can be defined as a non-discarding portion NDP. In addition, in the direction X, a region of the substrate at the left side of the target line 1021 or at the right side of the target line 1023, a region of the substrate between the target line 1021 and the edge 1001, or a region of the substrate between the target line 1023 and the edge 1003 can be defined as a discarding portion DP. In other words, the target line 1021 or the target line 1023 can be defined as a boundary BD between the non-discarding portion NDP and the discarding portion DP. In addition, the discarding portion DP can be removed after the cutting process and the grinding process, and at least a portion of the non-discarding portion NDP can be retained after the cutting process and the grinding process.

As shown in FIG. 4, a step S102 is then performed to form a first test wiring extending through the non-discarding portion and the discarding portion. As shown in FIG. 1, a test wiring 1081 and/or a test wiring 1083 (both of which can also be referred to as the first test wirings) can be formed on the non-discarding portion NDP and the discarding portion DP, and the test wiring 1081 and the test wiring 1083 can have the same or similar structures. In this embodiment, the test wiring 1081 can be disposed corresponding to the edge 1001 (such as a short side), and the test wiring 1083 can be disposed corresponding to the edge 1003 (such as another short side), but not limited thereto.

The test wiring 1081 or the test wiring 1083 can include a wiring 1101 (which can be referred to as a first wiring), a wiring 1102 (which can be referred to as a second wiring), a wiring 1103 (which can also be referred to as the second wiring), and a testing pad 1121 (which can be referred to as a first testing pad) and a testing pad 1122 (which can also be referred to as the first testing pad), but not limited thereto.

The wiring 1101 can be disposed in the discarding portion DP or in the peripheral region PA, and can extend along the boundary BD (i.e., the target line 1021 or the target line 1023) between the non-discarding portion NDP and the discarding portion DP. An extending direction of the wiring 1101 can be parallel to the direction Y, but not limited thereto. The wiring 1102 and the wiring 1103 can extend through the non-discarding portion NDP and the discarding portion DP, and an extending direction of the wiring 1102 and the wiring 1103 can be parallel to the direction X, but not limited thereto. Therefore, the extending direction of at least a portion of the wiring 1102 and at least a portion of the wiring 1103 is different from the extending direction of the wiring 1101. Furthermore, an end of the wiring 1101 can be connected to an end of the wiring 1102, and another end of the wiring 1101 can be connected to an end of the wiring 1103.

The testing pad 1121 and the testing pad 1122 can be disposed in the non-discarding portion NDP or in the display region AA, the testing pad 1121 can be connected to another end of the wiring 1102, and the testing pad 1122 can be connected to another end of the wiring 1103. Therefore, the testing pad 1121 can be electrically connected to the wiring 1101 through the wiring 1102, and the testing pad 1122 can be electrically connected to the wiring 1101 through the wiring 1103. Therefore, the method of the present disclosure can measure a conducting state of the test wiring 1081 or the test wiring 1083 through the testing pad 1121 and the testing pad 1122.

The wiring 1101, the wiring 1102, the wiring 1103, the testing pad 1121, and the testing pad 1122 can be formed on the surface 100F of the substrate 100, but not limited thereto. The wiring 1101, the wiring 1102, the wiring 1103, the testing pad 1121, and the testing pad 1122 can include metals, transparent conductive materials, or other suitable conductive materials. The wiring 1101, the wiring 1102, and the wiring 1103 of this embodiment can include transparent conductive materials (e.g., indium tin oxide (ITO)), but not limited thereto. In addition, a structure of the test wiring 1081 and/or a structure of the test wiring 1083 disclosed in the present disclosure are not limited to this embodiment, and may have other modified structures.

As shown in FIG. 4, a step S104 is then performed to cut the substrate on a target line, wherein the target line is aligned with a boundary between the non-discarding portion and the discarding portion. In the cutting process, the target line can serve as a default cutting line, and the cutting process cut the substrate on the cutting line. However, due to an aligning accuracy of machines, the cutting line on the substrate may not completely coincide with the target line. Therefore, the target line may be an ideal cutting line. In addition, the term "align" can refer to the target line and the boundary coinciding with each other.

As shown in FIG. 1, the cutting process can be performed and the substrate 100 can be cut on the target line 1021 and/or the target line 1023. In the cutting process, the substrate 100 can, for example, be cut by a cutter wheel, a laser, or other suitable cutting tools. Since a deviation in a cutting position or direction during the cutting process might occur, the upper specification limit (such as the specification line 1062 or the specification line 1065) and the lower specification limit (such as the specification line 1061 or the specification line 1064) are usually set to provide an allowable range of the process.

Figure 2:
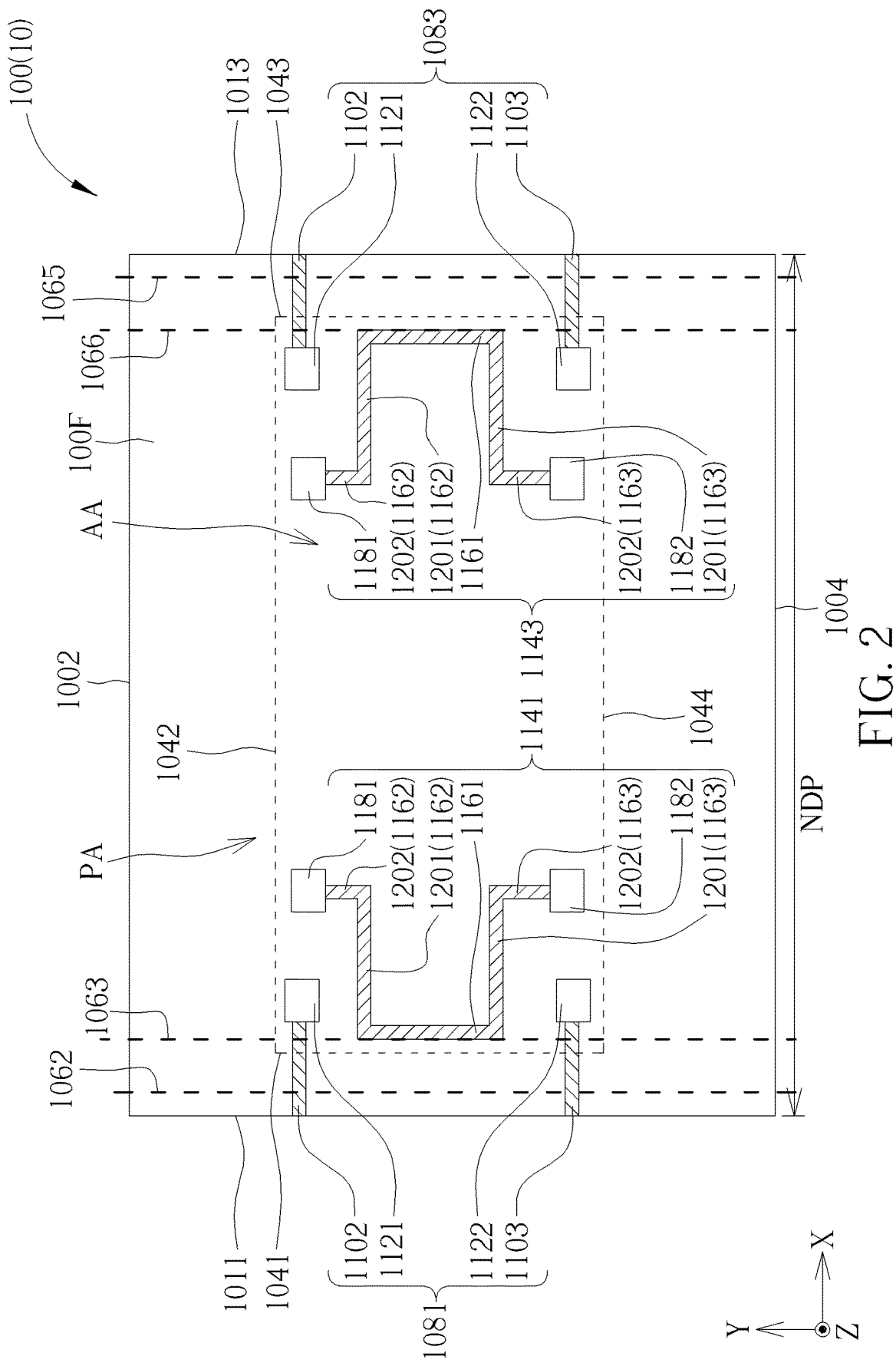
FIG. 2 is a top schematic view of the substrate of the electronic device that has been cut according to the first embodiment of the present disclosure.

Referring to FIG. 1 and FIG. 2, FIG. 2 is a top schematic view of the substrate of the electronic device that has been cut according to the first embodiment of the present disclosure. As shown in FIG. 2, after the cutting process of cutting the substrate 100 along the direction Y and corresponding to the target line 1021 and the target line 1023 of FIG. 1, a portion of the substrate 100 at the left side of the target line 1021 in FIG. 1 can be removed, and a portion of the substrate 100 at the right side of the target line 1023 in FIG. 1 can be removed, the test wirings 1101 in the test wiring 1081 and the test wirings 1083 can also be removed, and an edge 1011 and an edge 1013 of the substrate 100 can be exposed. Or, taking the test wiring 1081 of FIG. 1 as an example, after the cutting process of cutting the substrate 100 along the direction Y and at a position between the wiring 1101 and the specification line 1062 (the upper specification limit of the cutting process), the wiring 1101 and a portion of the substrate 100 can be removed together.

According to the above situation, as shown in FIG. 2, a conductive path between the testing pad 1121 and the testing pad 1122 in the test wiring 1081 are cut after the cutting process, so that the testing pad 1121 and the testing pad 1122 are electrically isolated. In addition, the above description can also be applied to the test wiring 1083, and will not be reiterated herein.

As shown in FIG. 4, a step S106 is then performed to perform a first conducting test on the first test wiring. As shown in FIG. 2, the test wiring 1081 or the test wiring 1083 can be performed with the first conducting test through the testing pad 1121 and the testing pad 1122. Then, a step S108 in FIG. 4 is performed, the substrate is determined to be in an off-target cutting state when a result of the first conducting test is a short circuit state, or the substrate is determined to be in an on-target cutting state when the result of the first conducting test is an open circuit state.

As shown in FIG. 1 and FIG. 2, when the result of the first conducting test is the short circuit state, the conductive path between the testing pad 1121 and the testing pad 1122 is not cut off, indicating that the cutting position of the cutting process may fall in a region between the specification line 1061 (the lower specification limit of the cutting process) and the edge 1001 of the substrate 100, or the cutting process is not performed along the direction Y. Therefore, the substrate 100 can be determined to be in the off-target cutting state, and the substrate can be determined to be a controlled product. If the substrate is determined to be the controlled product, exposed edges of the substrate are required to be grinded for a longer time in the subsequent grinding process, and the first conducting test is performed again after the grinding process.

As shown in FIG. 2, when the result of the first conducting test is the open circuit state, the conductive path between the testing pad 1121 and the testing pad 1122 is cut off, indicating that the cutting position of the cutting process falls in a region between the wiring 1101 and the specification line 1062 (the upper specification limit of the cutting process), or the cutting process may cut the substrate 100 on the target line 1021. Therefore, the substrate 100 can be determined to be in the on-target cutting state, and the substrate can be determined to be a qualified product.

As shown in FIG. 4, a step S110 is then performed to form a second test wiring in the non-discarding portion. As shown in FIG. 1 or FIG. 2, a test wiring 1141 and/or a test wiring 1143 (both of which can be referred to as the second test wirings) can be formed in the non-discarding portion NDP, and the test wiring 1141 and the test wiring 1143 can have the same or a similar structure. In this embodiment, the test wiring 1141 can be disposed corresponding to the edge 1001 (such as the short side), and the test wiring 1143 can be disposed corresponding to the edge 1003 (such as another short side), but not limited thereto.

The test wiring 1141 or the test wiring 1143 can include a wiring 1161 (which can be referred to as a third wiring), a wiring 1162 (which can be referred to as a fourth wiring), a wiring 1163 (which can also be referred to as the fourth wiring), and a testing pad 1181 (which can be referred to as a second testing pad) and a testing pad 1182 (which can also be referred to as the second testing pad), but not limited thereto.

The wiring 1161 can be disposed in the non-discarding portion NDP or in the display region AA, and can extend along the boundary BD (i.e., the target line 1021 or the target line 1023) between the non-discarding portion NDP and the discarding portion DP. An extending direction of the wiring 1161 can be parallel to the direction Y, but not limited thereto. The wiring 1162 and the wiring 1163 can be disposed in the non-discarding portion NDP or in the display region AA, and the wiring 1162 and the wiring 1163 can each include a line segment 1201 and a line segment 1202, but not limited thereto. An extension direction of the line segment 1201 can be parallel to the direction X, an extension direction of the line segment 1202 can be parallel to the direction Y, and an end of the line segment 1201 can be connected to an end of the line segment 1202, but not limited thereto. Therefore, the extending direction of at least a portion of the wiring 1162 and at least a portion of the wiring 1163 is different from the extending direction of the wiring 1161.

In addition, an end of the wiring 1161 can be connected to an end of the wiring 1162, and another end of the wiring 1161 can be connected to an end of the wiring 1163. As shown in FIG. 1, an end of the wiring 1161 can be connected to an end of the line segment 1201 of the wiring 1162, and another end of the wiring 1161 can be connected to an end of the line segment 1201 of the wiring 1163.

The testing pad 1181 and the testing pad 1182 can be disposed in the non-discarding portion NDP or in the display region AA, the testing pad 1181 can be connected to another end of the wiring 1162, and the testing pad 1182 can be connected to another end of the wiring 1163. As shown in FIG. 1 or FIG. 2, the testing pad 1181 can be connected to an end of the line segment 1202 of the wiring 1162, and the testing pad 1182 can be connected to an end of the line segment 1202 of the wiring 1163. Therefore, the testing pad 1181 can be electrically connected to the wiring 1161 through the wiring 1162, and the testing pad 1182 can be electrically connected to the wiring 1161 through the wiring 1163. Therefore, the method of the present disclosure can measure a conducting state of the test wiring 1141 or the test wiring 1143 through the testing pad 1181 and the testing pad 1182.

The wiring 1161, the wiring 1162, the wiring 1163, the testing pad 1181, and the testing pad 1182 can be formed on the same surface (i.e., the surface 100F) of the non-discarding portion NDP of the substrate 100, but not limited thereto. The wiring 1161, the wiring 1162, the wiring 1163, the testing pad 1181, and the testing pad 1182 can include metals, transparent conductive materials, or other suitable conductive materials. The wiring 1161, the wiring 1162, and the wiring 1163 of this embodiment can include transparent conductive materials (e.g., indium tin oxide (ITO)), but not limited thereto. In addition, a structure of the test wiring 1411 and/or a structure of the test wiring 1143 in the present disclosure are not limited to this embodiment, and may have other modified structures.

As shown in FIG. 4, a step S112 is then performed to grind the edge of the substrate exposed after being cut. As shown in FIG. 2, the edge 1011 and/or the edge 1013 exposed after the cutting process can be performed with the grinding process. For example, any suitable grinding tool can be used to grind the substrate 100. Considering the deviation in the grinding process, the upper specification limit (such as the specification line 1063 or the specification line 1066) can be set to provide an allowable range in the process.

Figure 3:
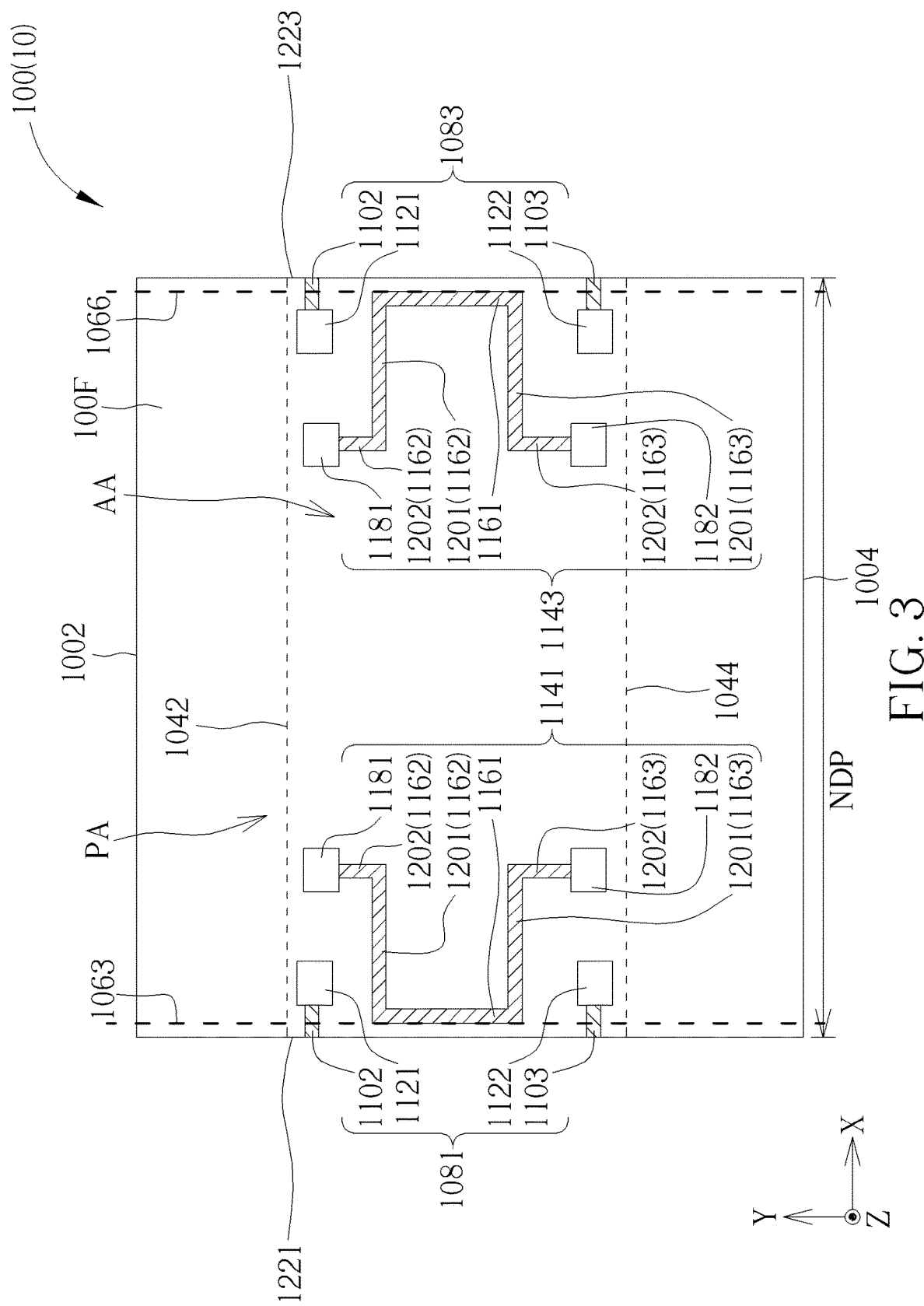
FIG. 3 is a top schematic view of the substrate of the electronic device that has been grinded according to the first embodiment of the present disclosure.

Referring to FIG. 2 and FIG. 3, FIG. 3 is a top schematic view of the substrate of the electronic device that has been grinded according to the first embodiment of the present disclosure. As shown in FIG. 3, when the edge 1011 and/or the edge 1013 of the substrate 100 in FIG. 2 is grinded to the target line 1041 and/or the target line 1043 by the grinding process, a portion of the substrate 100 at the left side of the target line 1041 in FIG. 2 can be removed, a portion of the substrate 100 at the right side of the target line 1043 in FIG. 2 can be removed, a portion of the wiring 1102 and a portion of the wiring 1103 can also be removed, and an edge 1221 and an edge 1223 of the substrate 100 can also be exposed. After the cutting process and the grinding process, the remaining non-discarding portion NDP of the substrate 100 can be retained, and the edge 1221 and the 1223 can substantially correspond to the edges of the display region AA, so as to achieve the borderless design.

In other embodiments, the edge 1011 and/or the edge 1013 of the substrate 100 in FIG. 2 can be grinded to the specification line 1063 and/or the specification line 1066. At this time, the edge 1221 of the substrate 100 in FIG. 3 can be substantially aligned with an outer edge of the wiring 1161 of the test wiring 1141, or the edge 1223 of the substrate 100 in FIG. 3 can be substantially aligned with an outer edge of the wiring 1161 of the test wiring 1143.

As shown in FIG. 4, a step S114 is then performed to perform a second conducting test on the second test wiring. As shown in FIG. 3, the second conducting test can be performed on the test wiring 1141 or the test wiring 1143 through the testing pad 1181 and the testing pad 1182. Then, a step S116 in FIG. 4 is performed, the substrate is determined to be in an off-target grinding state when a result of the second conducting test is an open circuit state, or the substrate is determined to be in an on-target grinding state when the result of the second conducting test is a short circuit state.

As shown in FIG. 3, when the result of the second conducting test is the open circuit state, the conductive path between the testing pad 1181 and the testing pad 1182 is cut off, indicating that the edges of the substrate 100 may have been grinded to exceed the specification line 1063 or the specification line 1066 in the grinding process, so that the wiring 1161 may have been removed. Therefore, the substrate 100 can be determined to be in the off-target grinding state, and the substrate 100 can be determined to be an unqualified product.

As shown in FIG. 3, when the result of the second conducting test is the short circuit state, the conductive path between the testing pad 1181 and the testing pad 1182 is not cut off, indicating that the edges of the substrate 100 are not grinded to exceed the specification line 1063 or the specification line 1066 in the grinding process, or indicating that the edges of the substrate 100 may be grinded to the target line 1041 or the target line 1043 in the grinding process. Therefore, the substrate 100 can be determined to be in the on-target grinding state, and the substrate can be determined to be a qualified product.

It should also be noted that, when the result of the first conducting test of the substrate 100 is the short circuit state, the first conducting test is required to be performed again in addition to the second conducting test after the grinding process. When the first conducting test result is the short circuit state and the second conducting test result is also the short circuit state, the substrate 100 is still necessary to be determined as the unqualified product. Since it indicates that the discarding portion of the substrate 100 has not yet been removed after the cutting process and the grinding process, it may cause the borderless design cannot be achieved in a subsequent tiling process of the substrate 100.

Therefore, through the manufacturing method of the electronic device of this embodiment, it is not necessary to utilize an optical microscope (OM) to confirm whether the frame or the results of cutting and grinding meet the specifications by a person after the manufacturing process of the display module is finished. In the manufacturing method of the electronic device of this embodiment, simple conducting tests can be performed to determine whether the results of cutting or grinding meet the specifications during the manufacturing process, which can greatly shorten the testing time and reduce the probability of human error.

In addition, in a conventional display device, a testing pad is usually disposed in a peripheral region PA, and various tests may be required to be performed after the manufacturing process of the display module is finished, causing a frame width unable to be effectively reduced. However, in the manufacturing method of the electronic device of this embodiment, the testing pads can be disposed in the display region AA (for example, the rectangular region formed by the target line 1041, the target line 1042, the target line 1043, and the target line 1044), so that the frame can be effectively reduced to the edges of the display region AA, so as to achieve the borderless design.

In this embodiment (as shown in FIG. 1), the test wiring 1081, the test wiring 1083, the test wiring 1141, and the test wiring 1143 can be formed on the substrate 100 before the cutting process is performed, but not limited thereto. In some embodiments, the test wiring 1081 and the test wiring 1083 can be formed on the substrate 100 before the cutting process is performed, and the test wiring 1141 and the test wiring 1143 can be formed on the substrate 100 after the cutting process and before the grinding process is performed, but not limited thereto.

The steps shown in the manufacturing method of the electronic device in FIG. 4 may be incomplete, and other steps can be performed before, after, or between any shown steps. In addition, certain steps can be performed in a different order. The manufacturing method of the electronic device of this embodiment can include step S100 to step S116. In some embodiments, the manufacturing method of the electronic device can include step S100 to step S108. In addition, the first conducting test and the second conducting test of this embodiment can also be applied to other embodiments.

The manufacturing method of the electronic device disclosed in the present disclosure is not limited to the foregoing embodiment. Other embodiments of the present disclosure are further discloses in the following. However, in order to simplify the description and highlight differences between the embodiments, the same reference numerals are used in the following to label the same elements, and the repetitive parts are not be reiterated herein.

Figure 5:
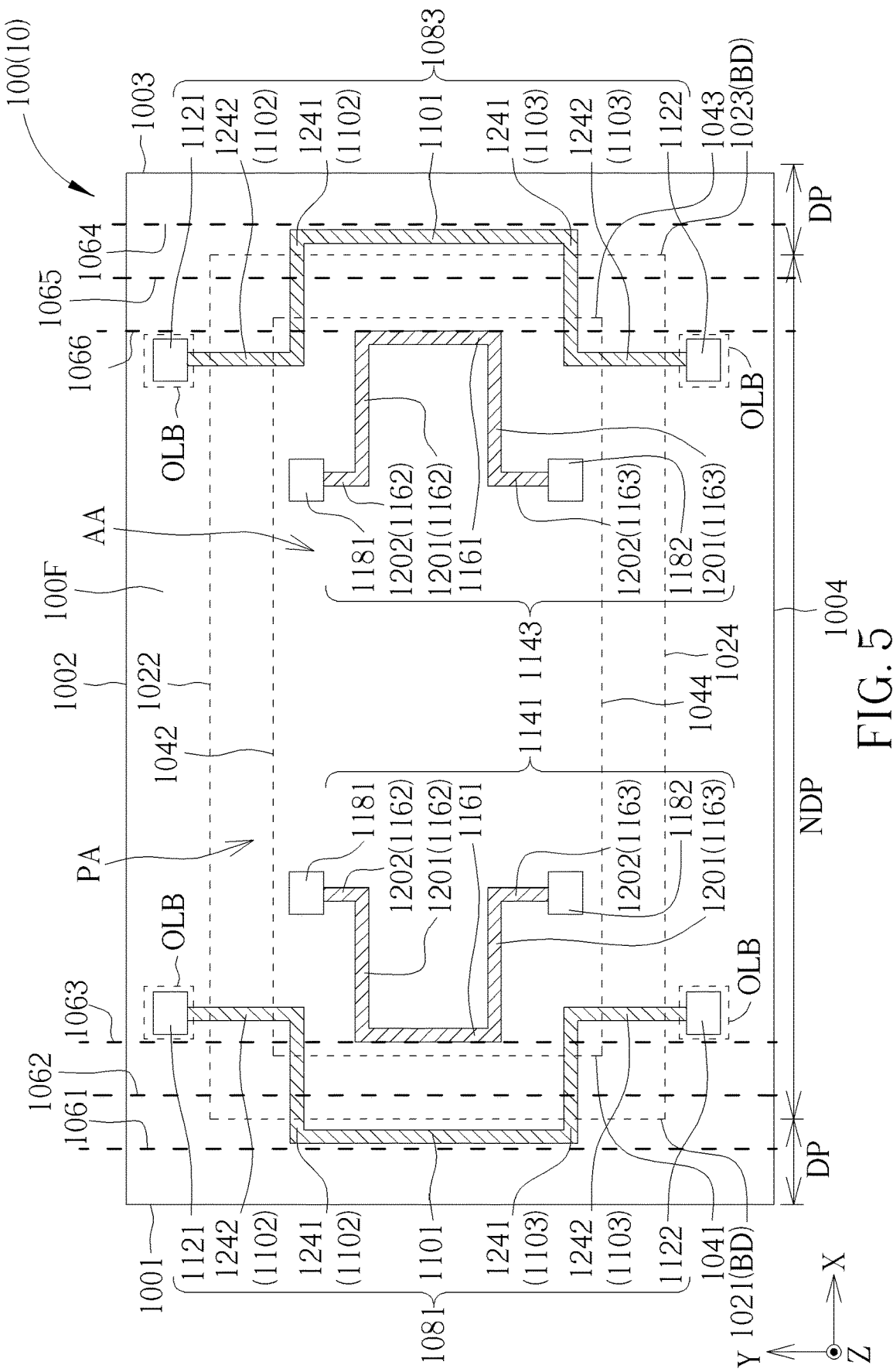
FIG. 5 is a top schematic view of a substrate of an electronic device without cutting and grinding according to a second embodiment of the present disclosure.

Referring to FIG. 5, which is a top schematic view of a substrate of an electronic device without cutting and grinding according to a second embodiment of the present disclosure. The difference between this embodiment and the first embodiment (as shown in FIG. 1) is that the testing pad 1121 and the testing pad 1122 of the test wiring 1081 or the test wiring 1083 in this embodiment can be disposed in an outer lead bonding portion OLB and the non-discarding portion NDP of the peripheral region PA of the substrate 100. The outer lead bonding portion OLB can be disposed on at least one side of the display region AA, as shown in FIG. 5, the outer lead bonding portion OLB can be disposed on both sides of the display region AA in the direction Y, but not limited thereto. It should be noted that the outer lead bonding portion OLB can be removed after the edge 1002 and/or the edge 1004 (such as a long side) is cut and grinded later, but not limited thereto.

The wiring 1102 and the wiring 1103 can each include a line segment 1241 and a line segment 1242, but not limited thereto. An extension direction of the line segment 1241 can be parallel to the direction X, an extension direction of the line segment 1242 can be parallel to the direction Y, and an end of the line segment 1241 can be connected to an end of the line segment 1242, but not limited thereto. Therefore, the extending direction of at least a portion of the wiring 1102 and at least a portion of the wiring 1103 is different from the extending direction of the wiring 1101. In addition, an end of the wiring 1101 can be connected to an end of the line segment 1241 of the wiring 1102, and another end of the wiring 1101 can be connected to an end of the line segment 1241 of the wiring 1103.

The testing pad 1121 can be connected to an end of the line segment 1242 of the wiring 1102, and the testing pad 1122 can be connected to an end of the line segment 1242 of the wiring 1103. Therefore, the testing pad 1121 can be electrically connected to the wiring 1101 through the wiring 1102, and the testing pad 1122 can be electrically connected to the wiring 1101 through the wiring 1103. The remaining features of this embodiment can be the same as the first embodiment, and can achieve the same effects as the first embodiment, and will not be reiterated herein.

Figure 6:
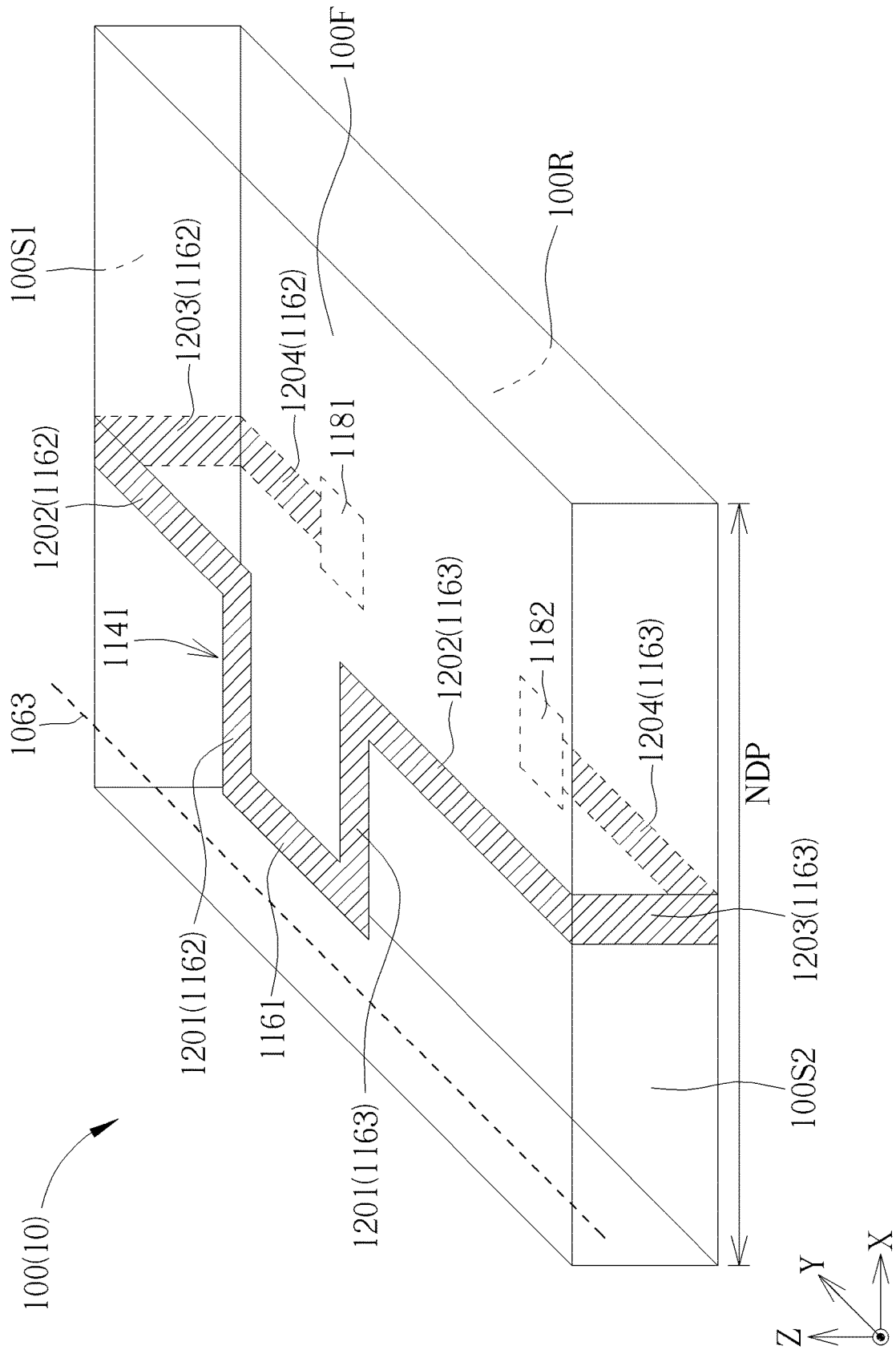
FIG. 6 is a schematic view of a portion of a substrate of an electronic device that has been cut and grinded according to a third embodiment of the present disclosure.

Referring to FIG. 6, which is a schematic view of a portion of a substrate of an electronic device that has been cut and grinded according to a third embodiment of the present disclosure. In order to highlight the technical features of the present embodiment and make the drawings easier to understand, FIG. 6 illustrates a portion of the substrate 100 corresponding to the test wiring 1141, omits the test wiring 1143, and also omits the remaining portion of the test wiring 1081 or the test wiring 1083 after being cut or grinded. As shown in FIG. 6, the substrate 100 (or the non-discarding portion NDP of the substrate 100) can include the surface 100F (or can be referred to as a first surface) and a surface 100R (or can be referred to as a second surface), and the surface 100F and the surface 100R can be two surfaces of the substrate 100 opposite to each other in the direction Z. The difference between this embodiment and the first embodiment (as shown in FIG. 1) is that the wiring 1161 in this embodiment can be formed on the surface 100F, and the testing pad 1181 and the testing pad 1182 can be formed on the surface 100R.

The line segment 1202 of the wiring 1162 can extend along the direction Y to an edge of the surface 100F of the substrate 100, and the line segment 1202 of the wiring 1163 can extend along the direction Y to another edge of the surface 100F of the substrate 100, but not limited thereto. In this embodiment, the wiring 1162 and the wiring 1163 can each include a line segment 1203 and a line segment 1204, but not limited thereto. The line segment 1203 of the wiring 1162 can be formed on a side surface 100S1 of the substrate 100 (or the non-discarding portion NDP of the substrate 100), the line segment 1203 of the wiring 1163 can be formed on a side surface 100S2 of the substrate 100 (or the non-discarding portion NDP of the substrate 100), and the line segment 1203 can extend along the direction Z, but not limited thereto. The side surface 100S1 and the side surface 100S2 can be two side surfaces of the substrate 100 opposite to each other in the direction Y, and the side surface 100S1 and the side surface 100S2 can be connected to the surface 100F and the surface 100R.

The line segments 1204 of the wiring 1162 and the wiring 1163 can be formed on the surface 100R, and the line segments 1204 can extend along the direction Y, but not limited thereto. An end of the line segment 1203 can be connected to an end of the line segment 1202 on the surface 100F, another end of the line segment 1203 can be connected to an end of the line segment 1204 on the surface 100R, and another end of the line segment 1204 can be connected to the testing pad 1181 or the testing pad 1182.

The line segment 1203, the line segment 1204, the testing pad 1181, and the testing pad 1182 can be formed after the cutting process and the grinding process are performed. The line segments 1203 can be formed on the side surface 100S1 and the side surface 100S2 through a side printing process, but not limited thereto. Therefore, the testing pad 1181 and the testing pad 1182 can be electrically connected to the wiring 1161 on the surface 100F through the side printing process. In addition, the wiring 1161, the line segment 1201, and the line segment 1202 can be formed before the grinding process, but not limited thereto. The remaining features of this embodiment can be the same as the above-mentioned embodiment, and can achieve the same effects as the first embodiment, and will not be reiterated herein.

Figure 7:
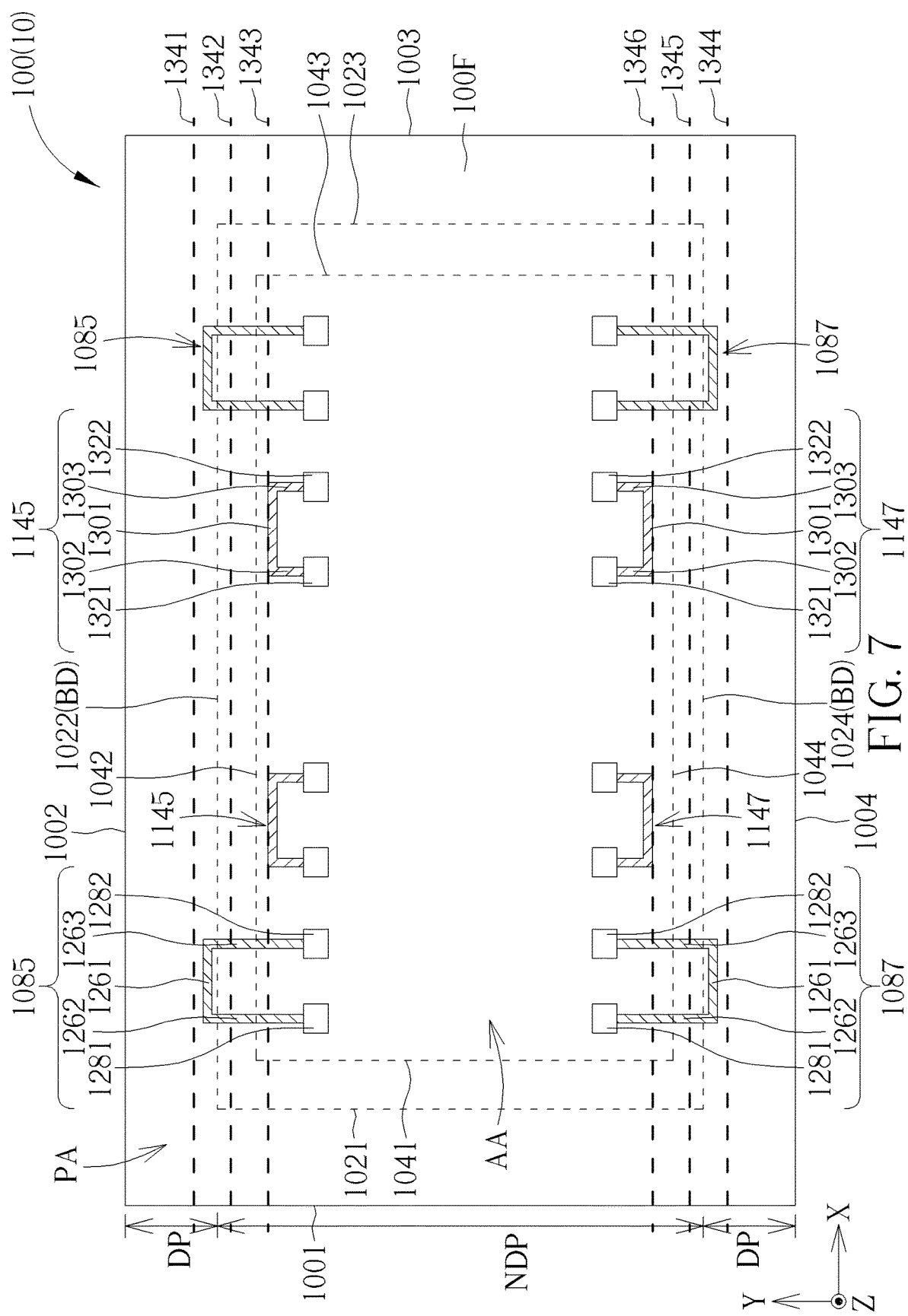
FIG. 7 is a top schematic view of a substrate of an electronic device without cutting and grinding according to a fourth embodiment of the present disclosure.

Referring to FIG. 7, which is a top schematic view of a substrate of an electronic device without cutting and grinding according to a fourth embodiment of the present disclosure. The difference between this embodiment and the first embodiment (as shown in FIG. 1) is that the edge 1002 and/or the edge 1004 (such as the long side) can be cut and grinded in this embodiment. In this embodiment, a specification line 1341 and a specification line 1342 can be defined based on the target line 1022 (a target line of the cutting process), and a specification line 1343 can be defined based on the target line 1042 (a target line of the grinding process). The specification line 1341 can be the lower specification limit of the cutting process, the specification line 1342 can be the upper specification limit of the cutting process, and the target line 1022 is disposed between the specification line 1341 and the specification line 1342. In addition, the specification line 1343 can be the upper specification limit of the grinding process, and the target line 1042 is disposed between the specification line 1342 and the specification line 1343.

Similarly, the target line 1024 (the target line of the cutting process) is disposed between a specification line 1344 and a specification line 1345, and the target line 1044 (the target line of the grinding process) is disposed between the specification line 1345 and a specification line 1346. The specification line 1344 can be the lower specification limit of the cutting process, the specification line 1345 can be the upper specification limit of the cutting process, and the specification line 1346 can be the upper specification limit of the grinding process.

As shown in FIG. 7, in the direction Y, a region of the substrate below the target line 1022 or above the target line 1024 or a region of the substrate between the target line 1022 and the target line 1024 can be defined as the non-discarding portion NDP. In addition, in the direction Y, a region of the substrate above the target line 1022 or below the target line 1024, or a region of the substrate between the target line 1022 and the edge 1002, or a region between the target line 1024 and the edge 1004 of the substrate can be defined as the discarding portion DP. In other words, the target line 1022 or the target line 1024 can be defined as the boundary BD between the non-discarding portion NDP and the discarding portion DP.

In addition, the first test wiring of this embodiment can include at least one test wiring 1085 and/or at least one test wiring 1087, and the second test wiring can include at least one test wiring 1145 and/or at least one test wiring 1147. As shown in FIG. 7, two test wirings 1085 and two test wirings 1145 can be disposed corresponding to the edge 1002 (such as the long side), and two test wirings 1087 and two test wirings 1147 can be disposed corresponding to the edge 1004 (such as another long side). A number of test wirings is not limited to that shown in FIG. 7.

The test wirings 1085 or the test wirings 1087 can each include a wiring 1261 (which can be referred to as the first wiring), a wiring 1262 (which can be referred to as the second wiring), a wiring 1263 (which can also be referred to as the second wiring), and a testing pad 1281 (which can be referred to as the first testing pad) and a testing pad 1282 (which can also be referred to as the first testing pad), but not limited thereto.

The wiring 1261 can be disposed in the discarding portion DP or in the peripheral region PA, and can extend along the boundary BD (i.e., the target line 1022 or the target line 1024). An extending direction of the wiring 1261 can be parallel to the direction X, but not limited thereto. The wiring 1262 and the wiring 1263 can extend through the non-discarding portion NDP and the discarding portion DP, and extending directions of the wiring 1262 and the wiring 1263 can be parallel to the direction Y, but not limited thereto. Furthermore, an end of the wiring 1261 can be connected to an end of the wiring 1262, and another end of the wiring 1261 can be connected to an end of the wiring 1263.

The testing pad 1281 and the testing pad 1282 can be disposed on the non-discarding portion NDP or in the display region AA, the testing pad 1281 can be connected to another end of the wiring 1262, and the testing pad 1282 can be connected to another end of the wiring 1263. Therefore, the testing pad 1281 can be electrically connected to the wiring 1261 through the wiring 1262, and the testing pad 1282 can be electrically connected to the wiring 1261 through the wiring 1263.

Taking the test wiring 1085 as an example, when the result of the first conducting test is the short circuit state, a conductive path between the testing pad 1281 and the testing pad 1282 is not cut off, indicating that the cutting position of the cutting process may fall in a region between the specification line 1341 (the lower specification limit of the cutting process) and the edge 1002 of the substrate 100, or the cutting process is not cutting along the direction X. Therefore, the substrate 100 can be determined to be in the off-target cutting state, and the substrate 100 can be determined to be an unqualified product.

When the result of the first conducting test is the open circuit state, the conductive path between the testing pad 1281 and the testing pad 1282 is cut off, indicating that the cutting position of the cutting process falls in a region between the wiring 1261 and the specification line 1342 (the upper limit of the specification of the cutting process, or indicating that the cutting process may cut the substrate 100 on the target line 1022. Therefore, the substrate 100 can be determined to be in the on-target cutting state, and the substrate 100 can be determined to be a qualified product.

In this embodiment, the wiring 1261, the wiring 1262, the wiring 1263, the testing pad 1281, and the testing pad 1282 can be formed on the surface 100F of the substrate 100, but not limited thereto. The wiring 1261, the wiring 1262, the wiring 1263, the testing pad 1281, and the testing pad 1282 can include metals, transparent conductive materials, or other suitable conductive materials. The wiring 1261, the wiring 1262 and the wiring 1263 of the present embodiment can include transparent conductive materials (such as indium tin oxide), but not limited thereto. In addition, a structure of the test wiring 1085 and/or a structure of the test wiring 1087 in the present disclosure are not limited to this embodiment, and may have other modified structures.

The test wiring 1145 or the test wiring 1147 can include a wiring 1301 (which can be referred to as the third wiring), a wiring 1302 (which can be referred to as the fourth wiring), a wiring 1303 (which can also be referred to as the fourth wiring), a testing pad 1321 (which can be referred to as the second testing pad), and a testing pad 1322 (which can also be referred to as the second testing pad), but not limited thereto.

The wiring 1301 can be disposed in the non-discarding portion NDP or in the display region AA, and can extend along the boundary BD (i.e., the target line 1022 or the target line 1024). An extending direction of the wiring 1301 can be parallel to the direction X, but not limited thereto. The wiring 1302 and the wiring 1303 can be disposed in the non-discarding portion NDP or in the display region AA, and extending directions of the wiring 1302 and the wiring 1303 can be parallel to the direction Y, but not limited thereto. Therefore, the extending direction of at least a portion of the wiring 1302 and at least a portion of the wiring 1303 is different from the extending direction of the wiring 1301. Furthermore, an end of the wiring 1301 can be connected to an end of the wiring 1302, and another end of the wiring 1301 can be connected to an end of the wiring 1303.

The testing pad 1321 and the testing pad 1322 can be disposed in the non-discarding portion NDP or in the display region AA, the testing pad 1321 can be connected to another end of the wiring 1302, and the testing pad 1322 can be connected to another end of the wiring 1303. Therefore, the testing pad 1321 can be electrically connected to the wiring 1301 through the wiring 1302, and the testing pad 1622 can be electrically connected to the wiring 1301 through the wiring 1303.

When the result of the second conducting test is the open circuit state, the conductive path between the testing pad 1321 and the testing pad 1322 is cut off, indicating that the edge of the substrate 100 may have been grinded to exceed the specification line 1343 or the specification line 1346 in the grinding process, so that the wiring 1301 may have been removed. Therefore, the substrate 100 can be determined to be in the off-target grinding state, and the substrate 100 can be determined to be an unqualified product.

When the result of the second conducting test is the short circuit state, the conductive path between the testing pad 1321 and the testing pad 1322 is not cut off, indicating that the edge of the substrate 100 has not been grinded to exceed the specification line 1343 or the specification line 1346 in the grinding process, or indicating that the edge of the substrate 100 may have been grinded to the target line 1042 or the target line 1044 in the grinding process. Therefore, the substrate 100 can be determined to be in the on-target grinding state, and the substrate 100 can be determined to be a qualified product.

In this embodiment, the wiring 1301, the wiring 1302, the wiring 1303, the testing pad 1321, and the testing pad 1322 can be formed on the same surface (i.e., the surface 100F) of the non-discarding portion NDP of the substrate 100, but not limited thereto. The wiring 1301, the wiring 1302, the wiring 1303, the testing pad 1321, and the testing pad 1322 can include metals, transparent conductive materials, or other suitable conductive materials. The wiring 1301, the wiring 1302, and the wiring 1303 of this embodiment can include transparent conductive materials (such as indium tin oxide), but not limited thereto. In addition, a structure of the test wiring 1145 and/or a structure of the test wiring 1147 in the present disclosure are not limited to this embodiment, and may have other modified structures. The steps and other features in the manufacturing method of this embodiment can be the same as those of the first embodiment, and can achieve the same effects as the first embodiment, and will not be reiterated herein.

In this embodiment, a plurality of signal lines can be disposed in the peripheral region PA located on both sides of the display region AA in the direction Y, so that a size (such as an area) of the test wiring 1085 or the test wiring 1087 can be smaller than a size of the test wiring 1081 or the test wiring 1083 in the first embodiment, or a size of the test wiring 1145 or the test wiring 1147 can be smaller than a size of the test wiring 1141 or the test wiring 1143 in the first embodiment. For example, a length of the wiring 1261 of the test wiring 1085 or the test wiring 1087 can be shorter than a length of the wiring 1101 of the test wiring 1081 or the test wiring 1083, or a length of the wiring 1301 of the test wiring 1145 or the test wiring 1147 can be shorter than a length of the wiring 1161 of the test wiring 1141 or the test wiring 1143, but not limited thereto.

Therefore, the test wiring may be prevented from occupying too much installation space of the signal lines in the peripheral region PA, which also reduces an electrical interference to the signal line from the test wiring. On the other hand, a number of the test wirings 1085 or the test wirings 1087 can be greater than a number of the test wirings 1081 or the test wirings 1083, or a number of the test wirings 1145 or the test wirings 1147 can be greater than a number of the test wirings 1141 or the test wirings 1143 to improve an accuracy of the test results of the substrate 100 after the cutting process and the grinding process.

Figure 8:
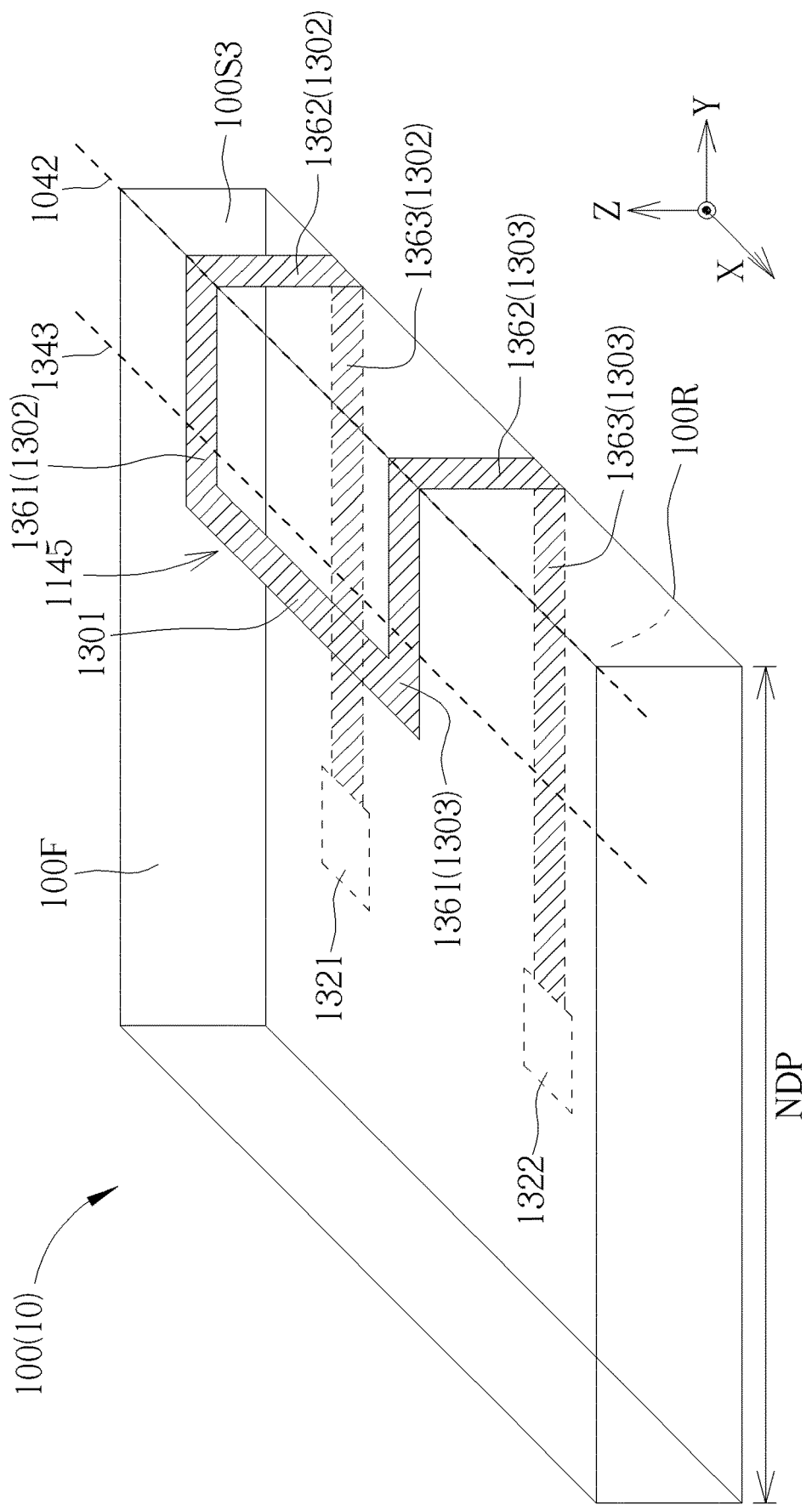
FIG. 8 is a schematic view of a portion of a substrate of an electronic device that has been cut and grinded according to a fifth embodiment of the present disclosure.

Referring to FIG. 8, which is a schematic view of a portion of a substrate of an electronic device that has been cut and grinded according to a fifth embodiment of the present disclosure. In order to highlight the technical features of the present embodiment and make the drawings easier to understand, FIG. 8 illustrates a portion of the substrate 100 corresponding to the test wiring 1145, omits the test wiring 1147, and also omits the remaining portion of the test wiring 1085 or the test wiring 1087 after being cut or grinded. The difference between this embodiment and the fourth embodiment (as shown in FIG. 7) is that the wiring 1301 of this embodiment can be formed on the surface 100F and the testing pad 1321 and the testing pad 1322 can be formed on the surface 100R.

The wiring 1302 and the wiring 1303 of this embodiment can each include a line segment 1361, a line segment 1362, and a line segment 1363. The line segments 1361 of the wiring 1302 and the wiring 1303 can extend along the direction Y to the edge of the surface 100F of the substrate 100, an end of the wiring 1301 can be connected to an end of the line segment 1361 of the wiring 1302, and another end of the wiring 1301 can be connected to an end of the line segment 1361 of the wiring 1303.

In the wiring 1302 and the wiring 1303, the line segment 1362 can be formed on a side surface 100S3 of the substrate 100 (or the non-discarding portion NDP of the substrate 100), and the line segment 1362 can extend along the direction Z. Taking FIG. 8 as an example, the side surface 100S3 can be a side surface formed by grinding the substrate 100 to the target line 1042 through the grinding process, but not limited thereto.

In the wiring 1302 and the wiring 1303, the line segment 1363 can be formed on the surface 100R, and the line segment 1363 can extend along the direction Y, but not limited thereto. An end of the line segment 1362 can be connected to an end of the line segment 1361 on the surface 100F, another end of the line segment 1362 can be connected to an end of the line segment 1363 on the surface 100R, and another end of the line segment 1363 can be connected to the testing pad 1321 or the testing pad 1322.

The line segments 1362, the line segments 1363, the testing pad 1321, and the testing pad 1322 can be formed after the cutting process and the grinding process are performed. The line segments 1362 can be formed on the side surface 100S3 through the side printing process, but not limited thereto. In addition, the wiring 1301 and the line segments 1361 can be formed before the grinding process is performed, but not limited thereto. The remaining features of this embodiment can be the same as the fourth embodiment (as shown in FIG. 7), and can achieve the same effects as the first embodiment, and will not be reiterated herein.

Figure 9:
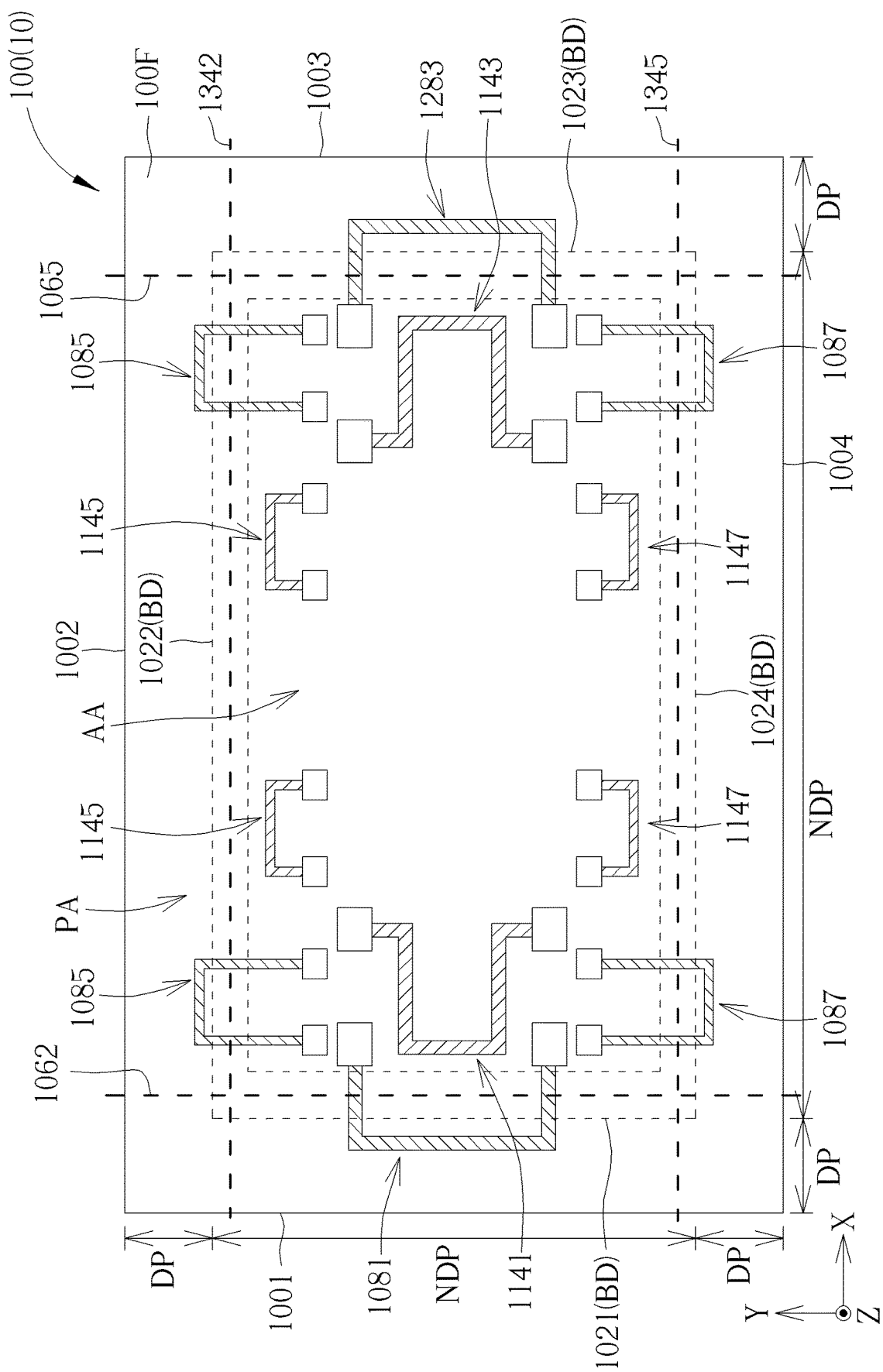
FIG. 9 is a top schematic view of a substrate of an electronic device without cutting and grinding according to a sixth embodiment of the present disclosure.
Figure 10:
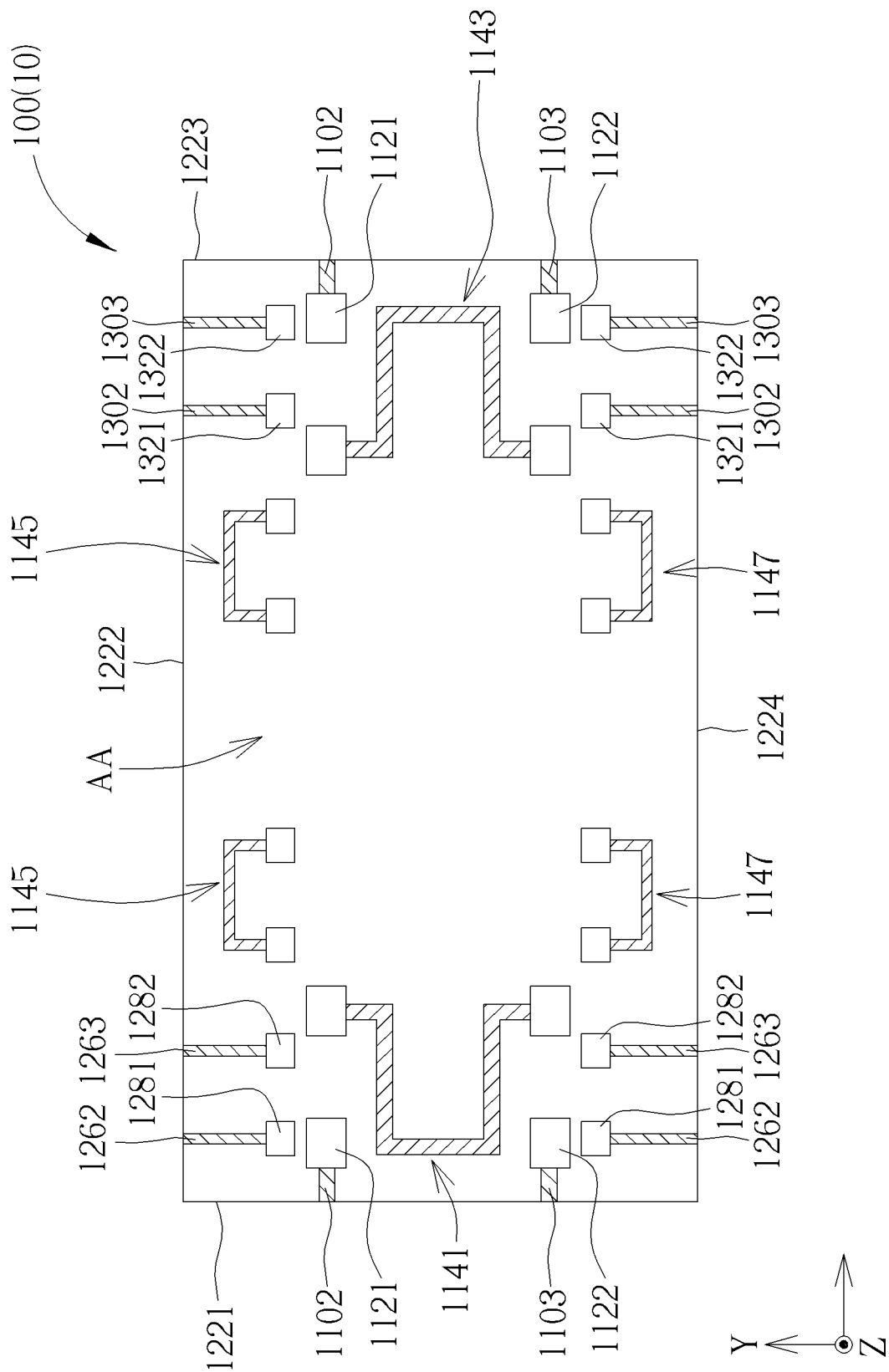
FIG. 10 is a top schematic view of the substrate of the electronic device that has been cut and grinded according to the sixth embodiment of the present disclosure.

Referring to FIG. 9 and FIG. 10. FIG. 9 is a top schematic view of a substrate of an electronic device without cutting and grinding according to a sixth embodiment of the present disclosure. FIG. 10 is a top schematic view of the substrate of the electronic device that has been cut and grinded according to the sixth embodiment of the present disclosure. As shown in FIG. 9, this embodiment can be a combination of the first embodiment (FIG. 1) and the fourth embodiment (FIG. 7). The first test wiring of this embodiment can include the test wiring 1081 and the test wiring 1083 of the first embodiment and the test wirings 1085 and the test wirings 1087 of the fourth embodiment, while the second test wiring of this embodiment can include the test wiring 1141 and the test wiring 1143 of the first embodiment and the test wirings 1145 and the test wirings 1147 of the fourth embodiment.

The test wiring 1081 and test wiring 1141 can be disposed corresponding to the edge 1001 (such as the short side), the test wiring 1083 and the test wiring 1143 can be disposed corresponding to the edge 1003 (such as another short side), two test wirings 1085 and two test wirings 1145 can be disposed corresponding to the edge 1002 (such as the long side), and the two test wirings 1087 and two test wirings 1147 can be disposed corresponding to the edge 1004 (such as another long side), but not limited thereto.

Therefore, for the cutting process and the grinding process, the first conducting test and the second conducting test can be performed on the first test wiring and the second test wiring through the method described in the first embodiment to check the states of cutting and grinding of four edges of the substrate 100. The substrate 100 after cutting and grinding in this embodiment can be as shown in FIG. 10. The edge 1221, an edge 1222, the edge 1223, and an edge 1224 of the substrate 100 can be aligned or substantially aligned with the edges of the display region AA of the display device to achieve the borderless design. The remaining features of this embodiment can be the same as the first embodiment and the fourth embodiment, and can achieve the same effects as the first embodiment, and will not be reiterated herein.

In summary, in the manufacturing method of the electronic device disclosed in the present disclosure, the first test wiring and the second test wiring are disposed on the substrate, and the first conducting test and the second conducting test are performed on the first test wiring and the second test wiring. Compared with the conventional testing method, the method disclosed in the present disclosure can be used to determine whether the results of cutting and grinding meet the specifications through simple conducting tests during the manufacturing process, which can greatly shorten the testing time and reduce the probability of human error. In addition, the testing pad can be disposed in the display region, so that the frame can be effectively reduced to the edges of the display region, so as to achieve the borderless design.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A manufacturing method of an electronic device, comprising:
    providing a substrate, wherein the substrate comprises a non-discarding portion and a discarding portion adjacent to the non-discarding portion;
    forming a test wiring in the non-discarding portion;
    cutting the substrate on a target line, wherein the target line is aligned with a boundary between the non-discarding portion and the discarding portion;
    grinding an edge of the substrate, wherein the edge of the substrate is exposed after the substrate is cut;
    performing a conducting test on the test wiring; and
    determining the substrate to be in an off-target grinding state when a result of the conducting test is an open circuit state, or determining the substrate to be in an on-target grinding state when the result of the conducting test is a short circuit state.

2. The manufacturing method according to claim 1, wherein the substrate comprises a display region and an outer lead bonding portion disposed on at least one side of the display region, the test wiring comprises a first wiring and a first testing pad in the display region, and the first testing pad is electrically connected to the first wiring.

3. The manufacturing method according to claim 1, wherein the test wiring comprises a third wiring and a second testing pad, the third wiring and the second testing pad are disposed in the non-discarding portion, the third wiring extends along the boundary, and the second testing pad is electrically connected to the third wiring.

4. The manufacturing method according to claim 3, wherein the test wiring further comprises a fourth wiring, the second testing pad is electrically connected to the third wiring through the fourth wiring, and at least an extending direction of a portion of the fourth wiring is different from an extending direction of the third wiring.

5. The manufacturing method according to claim 3, wherein the third wiring and the second testing pad are formed on a same surface of the non-discarding portion.

6. The manufacturing method according to claim 3, wherein the non-discarding portion comprises a first surface and a second surface opposite to the first surface, the third wiring is formed on the first surface and the second testing pad is formed on the second surface.

7. The manufacturing method according to claim 3, wherein the second testing pad is electrically connected to the third wiring through a side printing process.

* * * * *